(12) United States Patent
Okuie

(10) Patent No.: US 8,502,915 B2
(45) Date of Patent: Aug. 6, 2013

(54) IMAGING DEVICE

(75) Inventor: Takahiro Okuie, Nara (JP)

(73) Assignee: SANYO Electric Co., Ltd., Moriguchi-shi, Osaka (JP)

(*) Notice: Subject to any disclaimer, the term of this patent is extended or adjusted under 35 U.S.C. 154(b) by 388 days.

(21) Appl. No.: 12/829,823

(22) Filed: Jul. 2, 2010

(65) Prior Publication Data

US 2011/0007200 A1 Jan. 13, 2011

(30) Foreign Application Priority Data

Jul. 7, 2009 (JP) ................................. 2009-160439

(51) Int. Cl.
*H04N 5/225* (2006.01)

(52) U.S. Cl.
USPC .......................................... 348/374; 348/376

(58) Field of Classification Search
USPC .............................................. 348/373–376
See application file for complete search history.

(56) References Cited

U.S. PATENT DOCUMENTS

| 4,832,003 A * | 5/1989 | Yabe .............................. 600/109 |
| 2003/0025824 A1 | 2/2003 | Ishikawa |
| 2005/0088565 A1* | 4/2005 | Shimizu et al. ............... 348/340 |
| 2008/0180562 A1* | 7/2008 | Kobayashi .................... 348/340 |

FOREIGN PATENT DOCUMENTS

| JP | 11-261904 A | 9/1999 |
| JP | 2008-205723 A | 9/2008 |

* cited by examiner

*Primary Examiner* — Sinh Tran
*Assistant Examiner* — Mark Monk
(74) *Attorney, Agent, or Firm* — Westerman, Hattori, Daniels & Adrian, LLP

(57) ABSTRACT

An imaging device according to the present invention comprises a lens unit having a frame to which a lens is attached, an image sensor which ray of light that has passed the lens should enter, and a board member fixed to the frame of the lens unit, the board member being provided with an aperture for accommodating the image sensor, and the image sensor being adhered and fixed to the board member. Here, a protrusion which extends along an edge of the aperture is formed on a lens-side surface or a rear surface of the board member in at least a part of an area surrounding the aperture, and an adhesive is filled between the protrusion and the image sensor to fix the image sensor to the board member.

1 Claim, 5 Drawing Sheets

IMAGING DEVICE

The priority application Number 2009-160439, upon which this patent application is based, is hereby incorporated by reference.

BACKGROUND OF THE INVENTION

1. Field of the Invention

The present invention relates to imaging devices including an imaging sensor such as a digital camera.

2. Description of Related Art

This kind of imaging device comprises a lens unit having a frame to which a lens is attached and an image sensor which ray of light that has passed the lens should enter. A board member to which the image sensor is adhered and fixed is attached to the frame of the lens unit.

Conventionally, an image sensor 2 is adhered and fixed to a lens-side surface 35 of a board member 3 by an adhesive 7 as shown in FIG. 7, and therefore there is a problem of increase in overall thickness of the image sensor 2 and the board member 3.

Therefore, as shown in FIG. 8, there has been proposed to form an aperture 31 for accommodating the image sensor 2 in the board member 3, and adhere and fix the image sensor 2 to the board member 3 with the image sensor 2 accommodated in the aperture 31.

However, the board member 3 including the aperture 31 as shown in FIG. 8 has a decreased strength. Therefore, in a case where a stress is applied to the board member 3 and the image sensor 2, the board member 3 could be transformed, resulting in changing the posture of the image sensor 2 adhered and fixed to the board member 3 with respect to the frame of the lens unit. When the posture of the image sensor 2 changes with respect to the frame of the lens unit, photographing accuracy of the imaging device is reduced.

Also, in order to improve adhesive strength between the image sensor 2 and the board member 3, there has been considered to crush at least a part of an area surrounding the aperture 31 to form an adhesive reservoir 101 in said area as shown in FIG. 9 so that the adhesive 7 easily comes to intervene between the image sensor 2 and the board member 3. However, by crushing the board member 3, padding is generated, and therefore, there is a problem of decrease in surface accuracy of the lens-side surface 35 of the board member 3. When the surface accuracy of the lens-side surface 35 of the board member 3 decreases, the posture of the image sensor 2 changes with respect to the frame of the lens unit, and the photographing accuracy of the imaging device might be reduced.

SUMMARY OF THE INVENTION

An imaging device according to the present invention comprises a lens unit having a frame to which a lens is attached, an image sensor which ray of light that has passed the lens should enter, and a board member fixed to the frame of the lens unit, the board member being provided with an aperture for accommodating the image sensor, and the image sensor being adhered and fixed to the board member. Here, a protrusion which extends along an edge of the aperture is formed on a lens-side surface or a rear surface of the board member in at least a part of an area surrounding the aperture, and an adhesive is filled between the protrusion and the image sensor to fix the image sensor to the board member.

DETAILED DESCRIPTION OF THE EMBODIMENTS

In a preferred embodiment discussed in detail below with reference to drawings, the present invention is implemented in a digital camera.

Figure 1:
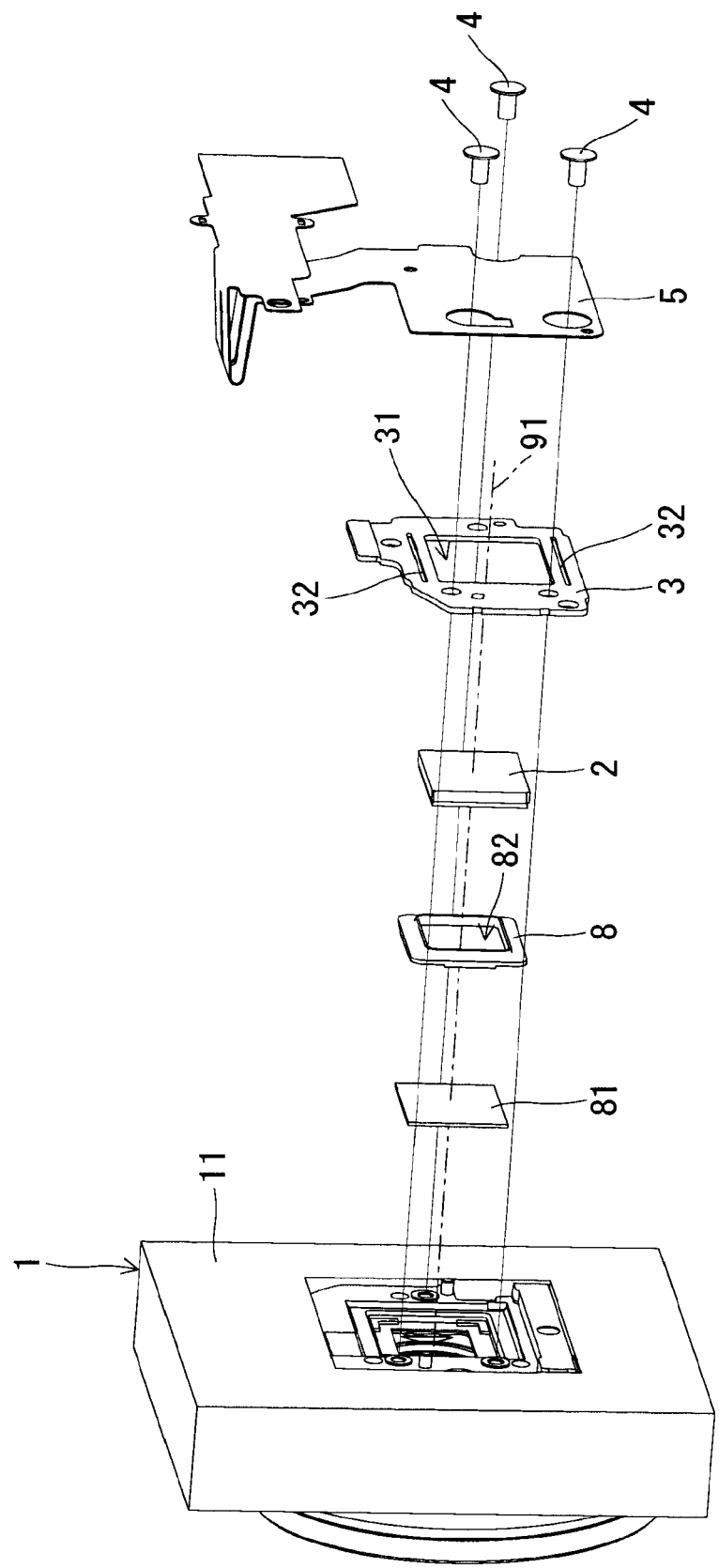
FIG. 1 is an exploded perspective view showing an imaging system of an imaging device according to one embodiment of the present invention.

As shown in FIG. 1, a digital camera according to the present invention comprises a lens unit 1 having a frame 11 to which a lens (not shown) is attached and an image sensor 2 which ray of light that has passed the lens of the lens unit 1 should enter. The lens unit 1 and the image sensor 2 form a part of an imaging system of the imaging device. As the image sensor 2, for example, a CCD (Charge Coupled Device) image sensor, a CMOS (Complementary Metal Oxide Semiconductor) image sensor or the like can be employed.

To the frame 11 of the above described lens unit 1, fixed is a board member 3 by a plurality of screws 4 to 4, and the board member 3 is provided with an aperture 31 for accommodating the image sensor 2 in a position on an optical axis 91 of the lens of the lens unit 1.

Figure 2:
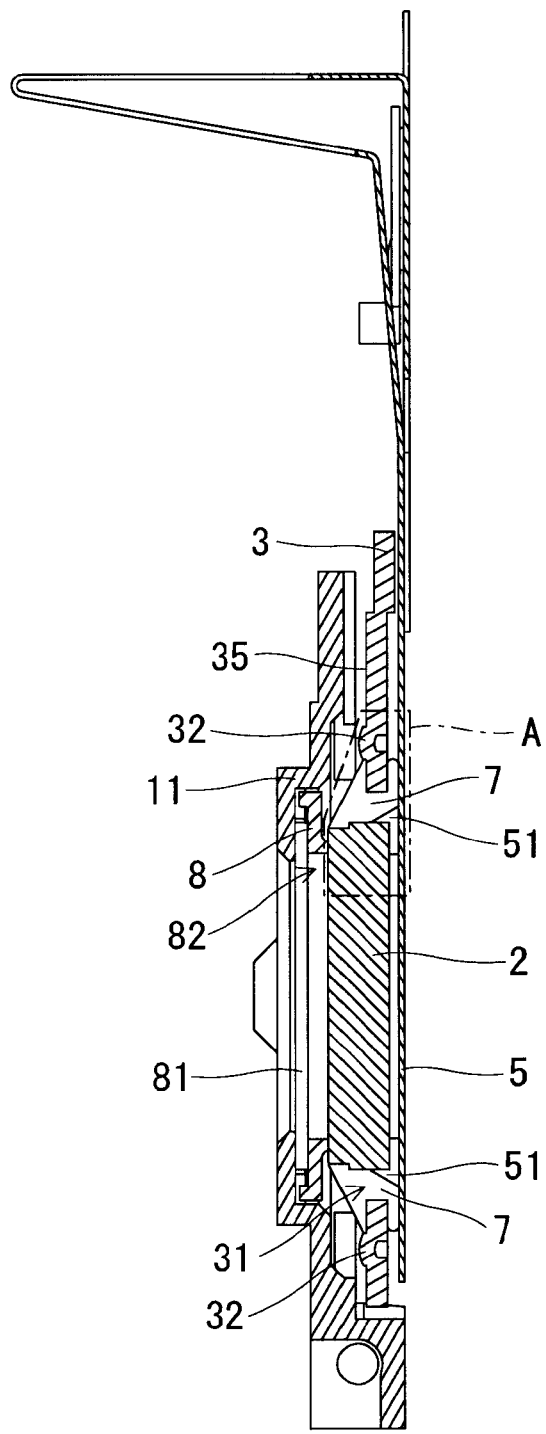
FIG. 2 is a vertical cross-sectional view of the imaging system.
Figure 3:
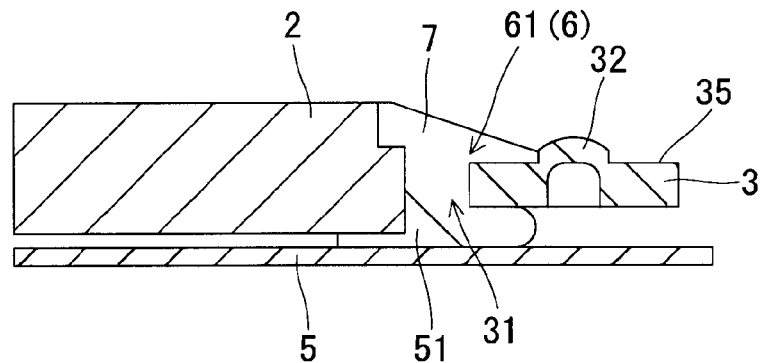
FIG. 3 is a cross-sectional view showing an area A of FIG. 2 in an enlarged manner.

A part of the board member 3 is bent to be transformed so that its cross section is in an inverted U-shape as shown in FIGS. 2 and 3, thereby forming a pair of protrusions 32, 32 which extend along edges of the aperture 31 on a lens-side surface 35 of the board member 3 in a part of an area surrounding the aperture 31, specifically at positions above and below the aperture 31 (see FIG. 1).

In this embodiment, the edge of the aperture 31 has a quadrangular shape as shown in FIG. 1, and is comprised of a vertically arranged pair of sides and a horizontally arranged pair of sides. Therefore, the pair of protrusions 32, 32 described above extends parallel to each other along the vertically arranged pair of sides at the positions above and below the aperture 31.

The image sensor 2 is accommodated in the aperture 31 of the board member 3 so that the board member 3 is located on a lateral surface side of the image sensor 2 as shown in FIGS. 2 and 3, and is mounted using a solder 51 on a surface of a flexible substrate 5 arranged on a rear surface side of the board member 3.

As shown in FIG. 3, thereby defined is a space 6 between the protrusion 32 of the board member 3 and the image sensor 2. The space 6 is surrounded by the surface of the flexible substrate 5, the lateral surface of the image sensor 2, the protrusion 32 of the board member 3, and an inner wall of the aperture 31 formed in the board member 3.

The above described space 6 is used as an adhesive reservoir 61 for storing an adhesive, and the adhesive reservoir 61 is filled with an adhesive 7. The adhesive 7 therefore intervenes between the inner wall of the aperture 31 and the lateral surface of the image sensor 2, and a part of the adhesive 7 projects on the surface 35 of the board member 3. The adhesive 7 which projects is held back by the protrusion 32. Hence, the adhesive 7 is filled between the protrusion 32 of the board member 3 and the image sensor 2.

Also, another part of the adhesive 7 intervenes between the rear surface of the board member 3 and the surface of the flexible substrate 5.

Due to hardening of the adhesive 7 filled in the adhesive reservoir 61, the image sensor 2 is adhered and fixed to the board member 3 while it is accommodated in the aperture 31 of the board member 3. At this time, the hardened adhesive 7 adheres to the lateral surface of the image sensor 2, and a part of said adhesive 7 adheres to the surface 35 of the board member 3 to cover the surface 35.

Also, the flexible substrate 5 is bonded to the rear surface of the board member 3 by said another part of the adhesive 7.

As shown in FIGS. 1 and 2, an elastic member 8 is arranged on the surface of the image sensor 2, and the elastic member 8 is provided with an opening 82 formed therein through which ray of light from the lens passes to enter the image sensor 2. A glass plate 81 is arranged on the elastic member 8 so as to cover the opening 82 of the elastic member 8, and the elastic member 8 and the glass plate 81 are pressed by the frame 11 of the lens unit 1 and the image sensor 2.

The elastic member 8 thereby comes into close contact with the surface of the image sensor 2 and the rear surface of the glass plate 81, and therefore, dirt or dust is prevented from attaching to the surface of the image sensor 2. Also, ray of light from the lateral direction toward the image sensor 2 is blocked by the elastic member 8.

In the digital camera described above, the protrusion 32 extends along the edge of the aperture 31 of the board member 3, and strength of the board member 3 thereby increases. Therefore, even if a stress is applied to the image sensor 2 because the elastic member 8 is pressed as described above, the board member 3 to which the image sensor 2 is adhered and fixed is not transformed easily, and because of this, the posture of the image sensor 2 does not easily change with respect to the frame 11 of the lens unit 1. Therefore, according to the digital camera described above, high photographing accuracy is maintained.

Further, the protrusion 32 formed on the board member 3 serves as an indicator which shows a position where the adhesive 7 should be applied in a manufacturing process. Therefore, the adhesive 7 is prevented from being applied to a wrong position in the manufacturing process, and as a result, adhesion failure of the image sensor 2 to the board member 3 hardly occurs.

Also, in a case where a part of the board member 3 is bent like in the above described digital camera, padding is not generated. Therefore, according to the above digital camera, the surface accuracy of the lens-side surface 35 of the board member 3 improves in comparison with a conventional imaging device (cf. FIG. 9) in which at least a part of the area surrounding the aperture 31 of the board member 3 is crushed to form the adhesive reservoir 101 in said area. Therefore, the posture of the image sensor 2 with respect to the frame 11 of the lens unit 1 does not easily change, and as a result, higher photographing accuracy is obtained in the digital camera according to this embodiment.

Further, because the adhesive 7 which projects on the surface 35 of the board member 3 is held back by the protrusion 32 of the board member 3, the adhesive 7 remains in a predetermined position around the image sensor 2, and the frame 11 of the lens unit 1 and the board member 3 are prevented from interfering with each other through the adhesive 7.

In the above described digital camera, because a part of the adhesive 7 which adheres to the image sensor 2 adheres to the lens-side surface 35 of the board member 3 to cover the surface 35 as described above, the adhesive 7 functions as a screw. Therefore, the stress applied to the image sensor 2 because the elastic member 8 is pressed is received by the surface 35 of the board member 3 via the image sensor 2 and the adhesive 7. Therefore, the image sensor 2 is fixed to the board member 3 strongly.

Also, because the board member 3 is pinched by the adhesive 7 as shown in FIG. 3, adhesive strength of the image sensor 2 to the board member 3 is enhanced.

Figure 4:
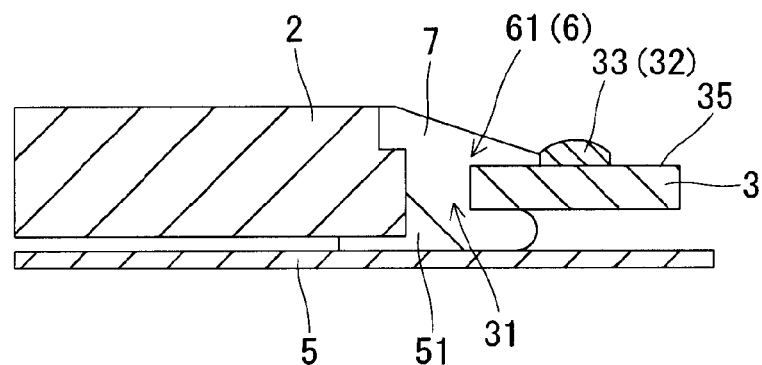
FIG. 4 is a cross-sectional view showing an essential part of a first modification of the imaging system.

FIG. 4 is a cross-sectional view showing a first modification of an imaging system of the above described digital camera. As shown in FIG. 4, the protrusion 32 of the board member 3 may be formed by bonding a protrusion component 33 which is to form the protrusion 32 to the lens-side surface 35 of the board member 3. For the protrusion component 33, brass or the like can be used, for example.

Figure 5:
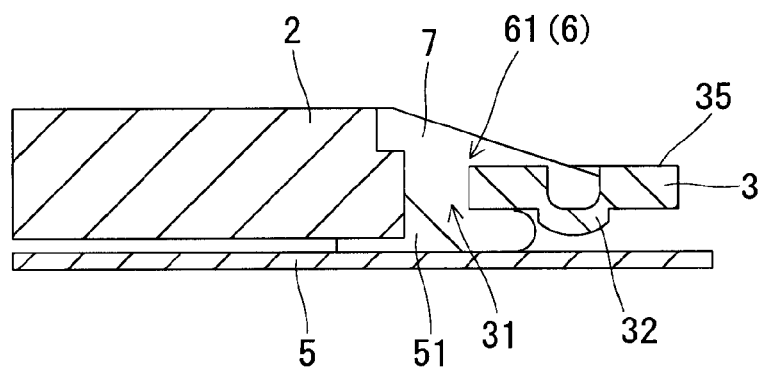
FIG. 5 is a cross-sectional view showing an essential part of a second modification of the imaging system.

FIG. 5 is a cross-sectional view showing a second modification of the imaging system of the above described digital camera. As shown in FIG. 5, the protrusion 32 may be formed on the rear surface of the board member 3 by bending a part of the board member 3 so that its cross section is in a U-shape.

In a similar manner to the digital camera described above, strength of the board member 3 increases also in the above described first and second modifications. Therefore, even if a stress is applied to the image sensor 2 because the elastic member 8 is pressed as described above, the board member 3 to which the image sensor 2 is adhered and fixed is not easily transformed, and therefore, the posture of the image sensor 2 does not easily change with respect to the frame 11 of the lens unit 1. Accordingly, in the digital camera of the above described first and second modifications, high photographing accuracy is maintained.

Also, in a similar manner to the digital camera described above, padding is not generated in the above described first and second modifications either. Therefore, according to the digital camera of the first and second modifications, the surface accuracy of the lens-side surface 35 of the board member 3 improves in comparison with the conventional imaging device (cf. FIG. 9) in which at least a part of the area surrounding the aperture 31 of the board member 3 is crushed to form the adhesive reservoir 101 in said area. Therefore, the posture of the image sensor 2 with respect to the frame 11 of the lens unit 1 does not easily change, and as a result, higher photographing accuracy is obtained in the digital camera of the first and second modifications.

Figure 6:
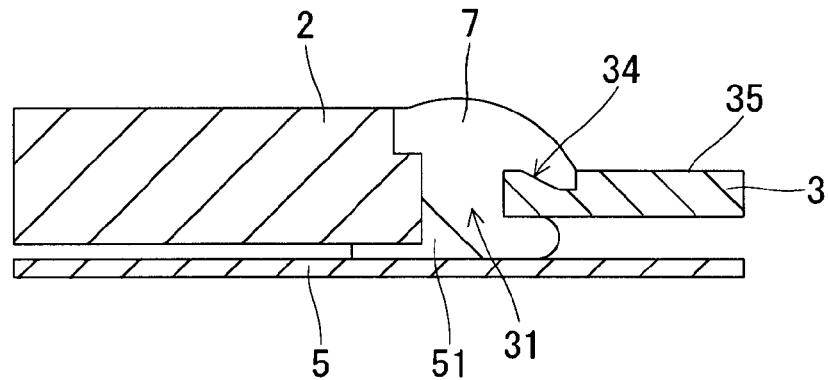
FIG. 6 is a cross-sectional view showing an essential part of a third modification of the imaging system.
Figure 7:
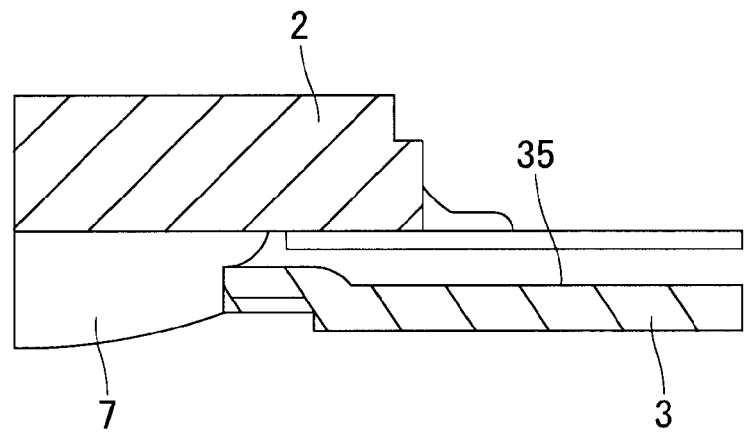
FIG. 7 is a cross-sectional view showing an essential part of an imaging system of an example of conventional imaging devices.
Figure 8:
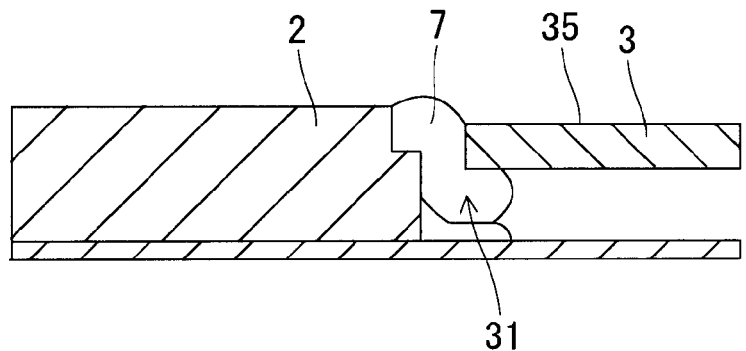
FIG. 8 is a cross-sectional view showing an essential part of an imaging system of another example of conventional imaging devices.

FIG. 6 is a cross-sectional view showing a third modification of the imaging system of the above described digital camera. As shown in FIG. 6, a wedge-shaped groove 34 which extends along the edge of the aperture 31 may be formed in the lens-side surface 35 of the board member 3 in at least a part of the area surrounding the aperture 31.

Figure 9:
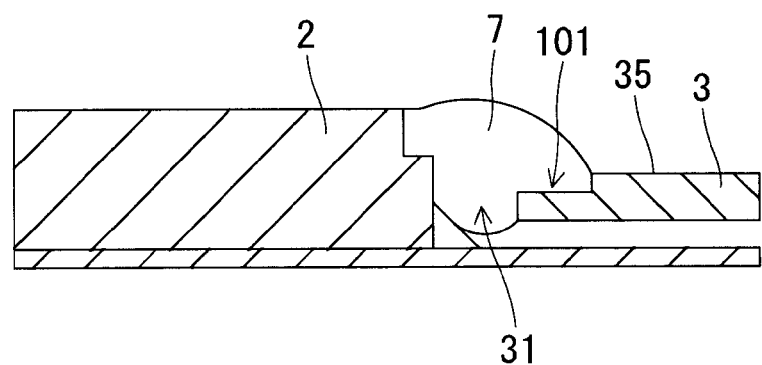
FIG. 9 is a cross-sectional view showing an essential part of an imaging system of a further example of conventional imaging devices.

In the third modification described above, although padding is generated by forming the groove 34 in the board member 3, because the shape of the groove 34 is wedge-shape, only a small amount of the board member 3 is crushed, resulting in a small amount of padding in comparison with the case in which the adhesive reservoir 101 is formed in the board member 3 as shown in FIG. 9. Therefore, the surface accuracy of the lens-side surface 35 of the board member 3 improves in comparison with a conventional imaging device including an imaging system as shown in FIG. 9. Accordingly, the posture of the image sensor 2 to the frame 11 of the lens unit 1 does not easily change, and as a result, in the digital camera of the second modification which includes an imaging system, high photographing accuracy is obtained.

The present invention is not limited to the foregoing embodiment in construction but can be modified variously by one skilled in the art without departing from the spirit of the invention as set forth in the appended claims. Although the protrusion 32 is formed in positions above and below the aperture 31 of the board member 3 in the above described embodiment, the formation position of the protrusion 32 is not limited to these. For example, the protrusion 32 may be formed so as to surround the aperture 31. That is, the protrusion 32 only needs to be formed in at least a part of the area surrounding the aperture 31.

Similarly, the wedge-shaped groove 34 of the third modification only needs to be formed in at least a part of the area surrounding the aperture 31.

Also, various configurations employed in the above described digital camera can be applied to various imaging devices including the image sensor 2 as well as a digital camera.

What is claimed is:

1. An imaging device comprising a lens unit having a frame to which a lens is attached, an image sensor which ray of light that has passed the lens should enter, and a board member fixed to the frame of the lens unit, the board member being provided with an aperture for accommodating the image sensor, and the image sensor being adhered and fixed to the board member, wherein a protrusion which extends along an edge of the aperture is formed on a lens-side surface of the board member in at least a part of an area surrounding the aperture, and an adhesive is filled between the protrusion and the image sensor to fix the image sensor to the board member, wherein a flexible substrate which is mounted with the image sensor is arranged on a rear surface side of the board member, an adhesive reservoir is formed in a space surrounded by a surface of the flexible substrate, a lateral surface of the image sensor, the protrusion of the board member, and an inner wall of the aperture formed in the board member, and the adhesive reservoir is filled with the adhesive.

* * * * *